United States Patent [19]

Burke

[11] 4,311,990
[45] Jan. 19, 1982

[54] PHOTO-OPTICAL KEYBOARDS

[75] Inventor: Greg M. Burke, Walnut, Calif.

[73] Assignee: Optical Techniques International, Inc., Torrance, Calif.

[21] Appl. No.: 961,111

[22] Filed: Nov. 16, 1978

[51] Int. Cl.³ .......................... G06F 3/02; H01H 9/16
[52] U.S. Cl. .............................. 340/365 P; 200/314; 200/317; 250/221; 400/491.3
[58] Field of Search ........... 340/365 R, 365 P, 365 E, 340/365 S, 365 VL, 365 C; 178/17 A, 17 C, 17 D, 17.5, 21; 179/90 K; 250/221, 227, 578, 229; 200/5 A, 310, 313, 314, 317; 400/479, 94, 482, 91, 491.3

[56] References Cited

U.S. PATENT DOCUMENTS

| | | | |
|---|---|---|---|
| 3,856,127 | 12/1974 | Halfon et al. | 340/365 P |
| 3,892,915 | 7/1975 | Budworth et al. | 340/365 P |
| 3,946,241 | 3/1976 | Malinowski | 250/221 |
| 4,110,748 | 8/1978 | Marino | 340/365 R |
| 4,138,916 | 2/1979 | Kitagawa | 340/365 S |
| 4,157,539 | 6/1979 | Hunts et al. | 340/365 S |
| 4,163,883 | 8/1979 | Boulanger | 200/314 |
| 4,205,304 | 5/1980 | Moore | 340/365 P |

OTHER PUBLICATIONS

"Scanned Optical Keyboard", Fox, IBM Technical Disclosure Bulletin, Feb. 1978, pp. 3615-3616.

Primary Examiner—James J. Groody
Attorney, Agent, or Firm—Blakely, Sokoloff, Taylor & Taylor

[57] ABSTRACT

Photo-optical keyboards for providing electrical signals responsive to the keying of the keyboard. The keyboard structure consists of an arrangement of individual keys disposed and identified in accordance with the particular application and adapted for longitudinal motion on depression thereof. Located below the plurality of keys is a matrix of light sources and photo detectors disposed in such a manner that depression of any single key will interrupt the light path between one of the light sources and one of the detectors to provide a change in the electrical state of the associated circuitry. The light sources and detectors are arranged so that in general a single light source illuminates a plurality of detectors, and each detector may be illuminated by any of a plurality of light sources, so that the number of light sources and sensors required for the complete keyboard is substantially less than the number of keys to be sensed. A microprocessor based system for scanning the light sources and detectors is disclosed. In general individual light channels in the keyboard structure are not required as a scanning technique avoids undesired optical cross-talk. By making a portion of each key substantially transparent, light from the light sources may be directed upward through the keys to illuminate the keyboard.

32 Claims, 10 Drawing Figures

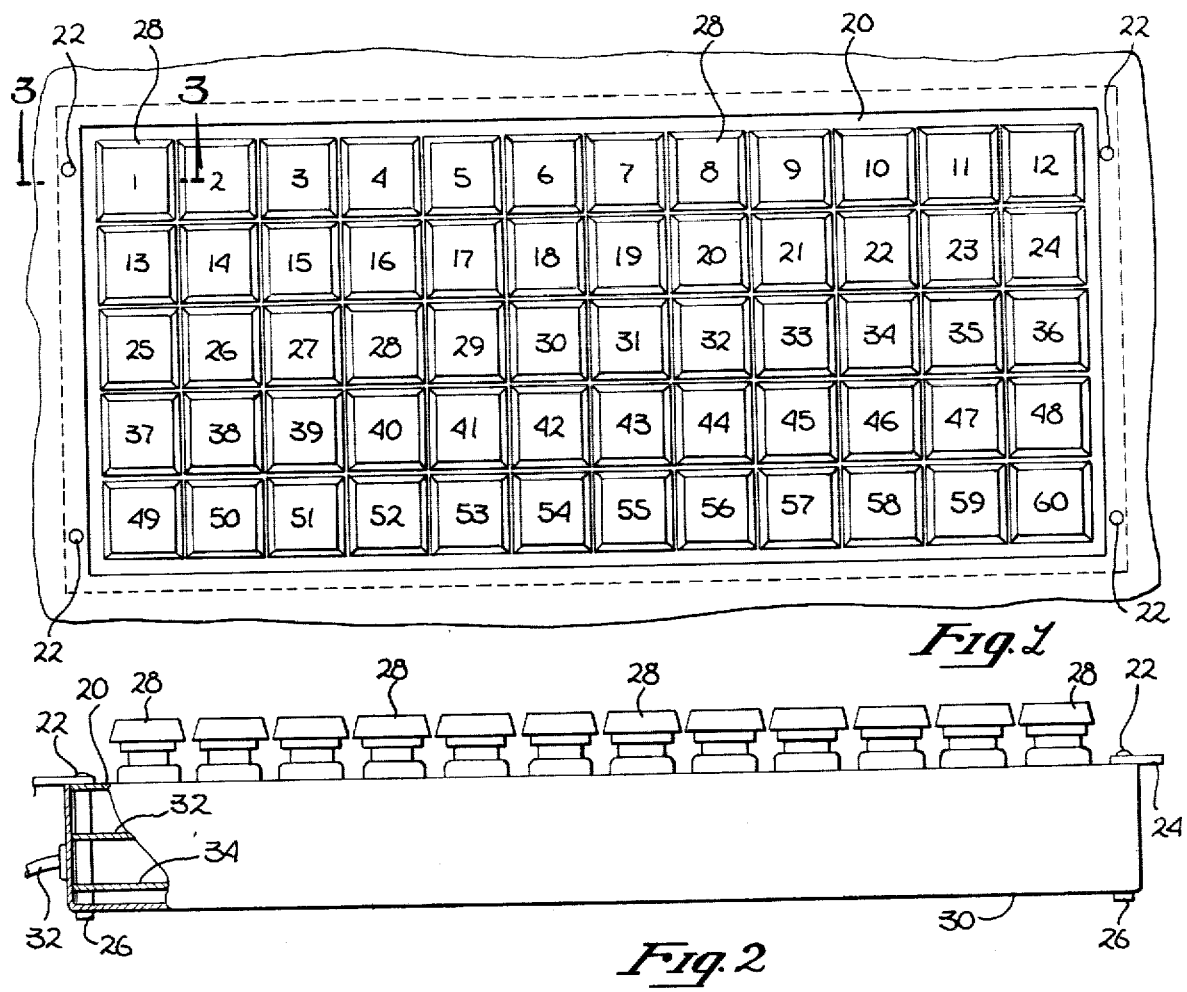
Fig. 1
Fig. 2
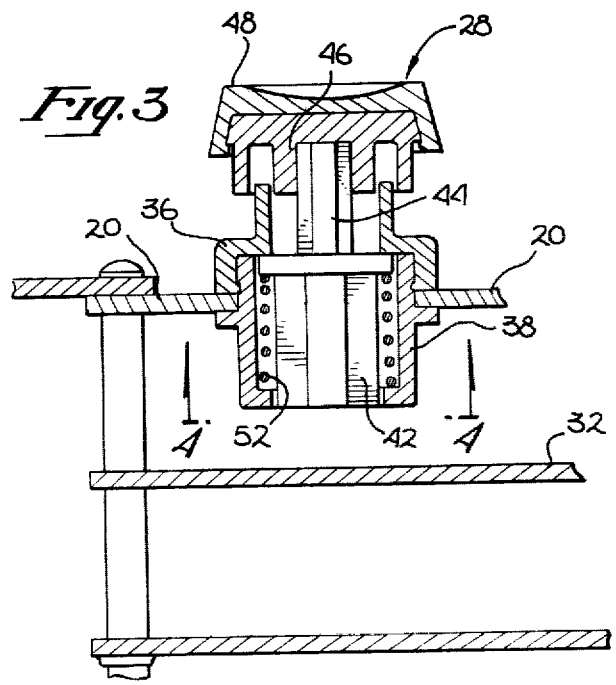
Fig. 3
Fig. 4

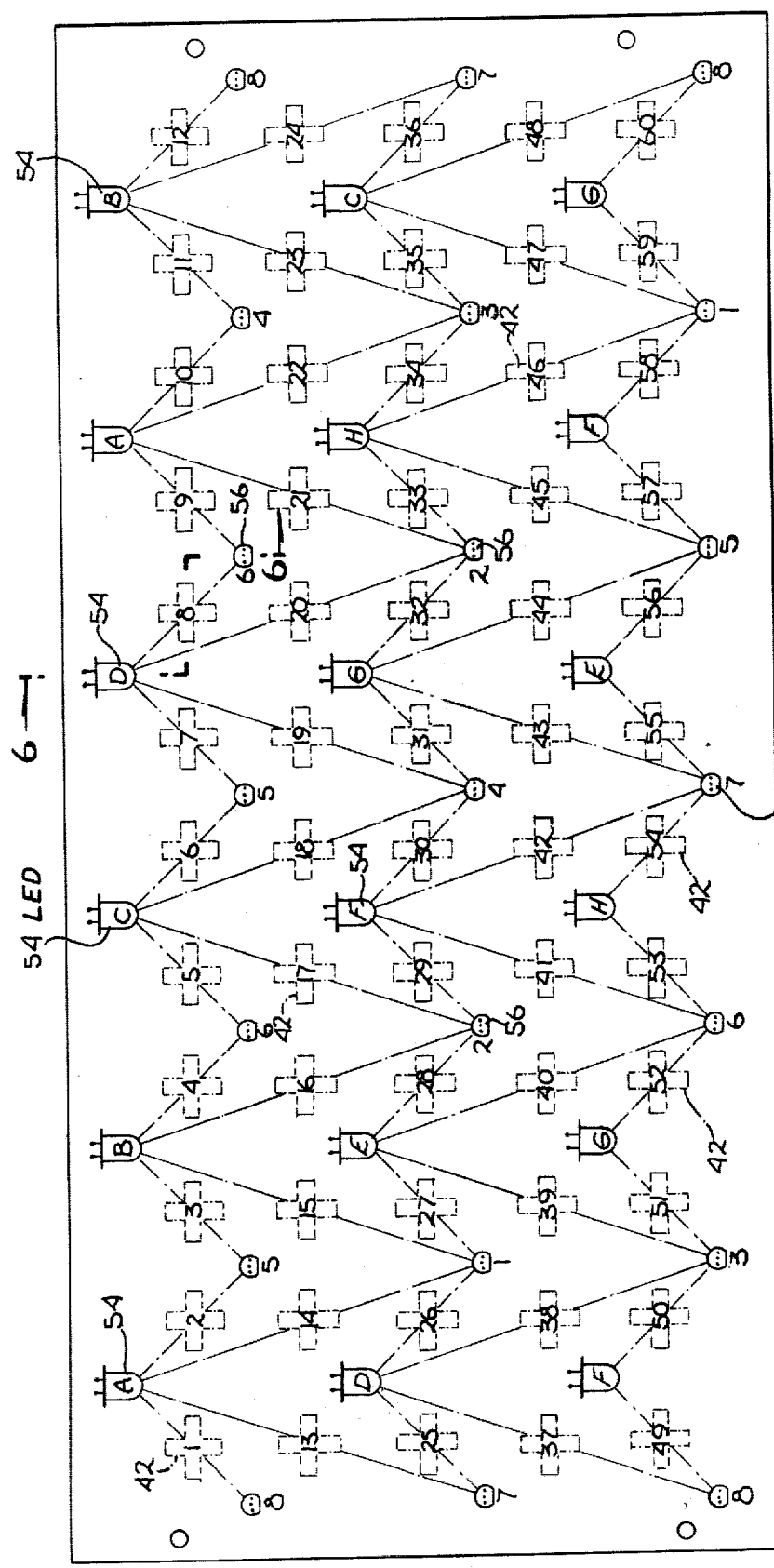
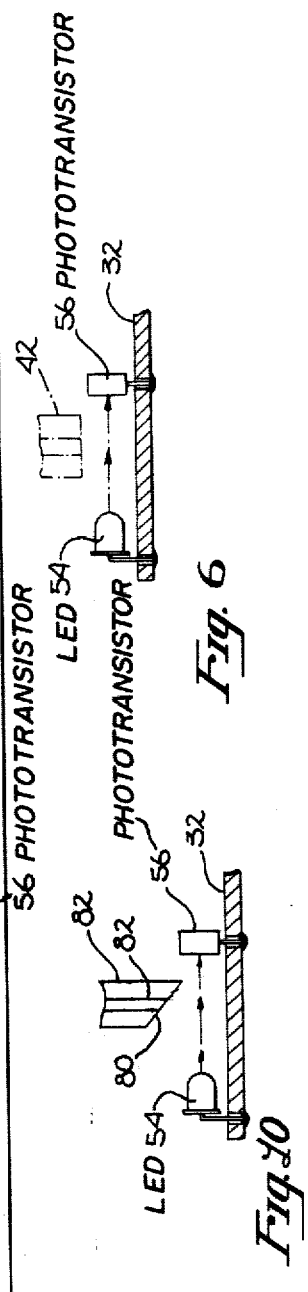
Fig. 5
Fig. 6
Fig. 10

PHOTO-OPTICAL KEYBOARDS

BACKGROUND OF THE INVENTION

1. Field of the Invention

The present invention relates to the field of keyboards.

2. Prior Art

Photo-optical keyboards of various types are known in the prior art. By way of example, certain types of keyboards are shown in U.S. Pat. No. 3,856,127. The primary embodiment disclosed in that patent has a plurality of light channels arranged in rows and columns with light sources at one end of each channel and photodetectors at the other end thereof. The channels forming the rows have a different depth than the channels forming the columns, with each key having two shutters coupled thereto disposed adjacent rather than on an intersection of the two channels so that each shutter may block one of the adjacent channels. Accordingly, depression of any given key will cause one shutter coupled thereto to block one light channel row whereas the other shutter will block one light channel column. Thus, a key may be identified by the particular row and column which is blocked by the depression of any given key. The system has the advantage that one light source and one detector is not required for every key, though has certain disadvantages with respect to cost and operation. The required light channels are relatively expensive to fabricate, and no means is disclosed for handling the case of simultaneous key depression. In fact, because of small differences in shutters, light channels, light sources, detectors, etc. the partial depression of two keys not disposed on the same row or column may be interpreted as the depression of a third key generally positioned at the intersection of the rows and columns, since one shutter of one key may block one row and the opposite shutter of the other key block the associated channel. Further, even if the depression of both keys is detected, no means is disposed to determine which key was depressed first or which key is released first. Other embodiments include reflectors on each key operating at the junction of the channels so that each key will reflect row light sources to column light detectors. In such a system, it is stated that a scanning means should be used, though details thereof are not given. Still other embodiments disclosed therein include a fiber-optic type device.

Other photo-optical keyboards or key-sensing systems are disclosed in U.S. Pat. Nos. 3,603,982; 3,648,050; 3,737,668 and 3,750,150. These systems, however, are entirely different from the present invention and generally lack the simplicity in design and flexibility and reliability in operation that the present invention provides.

BRIEF SUMMARY OF THE INVENTION

Photo-optical keyboards for providing electrical signals responsive to the keying of the keyboard. The keyboard structure consists of an arrangement of individual keys disposed and identified in accordance with the particular application and adapted for longitudinal motion on depression thereof. Located below the plurality of keys is a matrix of light sources and photo detectors disposed in such a manner that depression of any single key will interrupt the light path between one of the light sources and one of the detectors to provide a change in the electrical state of the associated circuitry. The light sources and detectors are arranged so that in general a single light source illuminates a plurality of detectors, and each detector may be illuminated by any of a plurality of light sources, so that the number of light sources and sensors required for the complete keyboard is substantially less than the number of keys to be sensed. A microprocessor based system for scanning the light sources and detectors is disclosed. In general individual light channels in the keyboard structure are not required as a scanning technique avoids undesired optical cross-talk.

BRIEF DESCRIPTION OF THE DRAWINGS

FIG. 1 is a face view of an exemplary keyboard in accordance with the present invention.

FIG. 2 is a side view partially cut away of the keyboard of FIG. 1.

FIG. 3 is a partial cross-section of a typical key taken through line 3—3 of FIG. 1.

FIG. 4 is a bottom view taken along line 4—4 of FIG. 3.

FIG. 5 is a face view of the sensor board illustrating the relative dispositions of the light sources, detectors and keyboard keys.

FIG. 6 is a partial cross-section taken along line 6—6 of FIG. 5, illustrating the general disposition of the light sources and detectors.

FIG. 10 is a view illustrating an alternate key shaft form to provide a lighted keyboard.

DETAILED DESCRIPTION OF THE INVENTION

Figure 7:
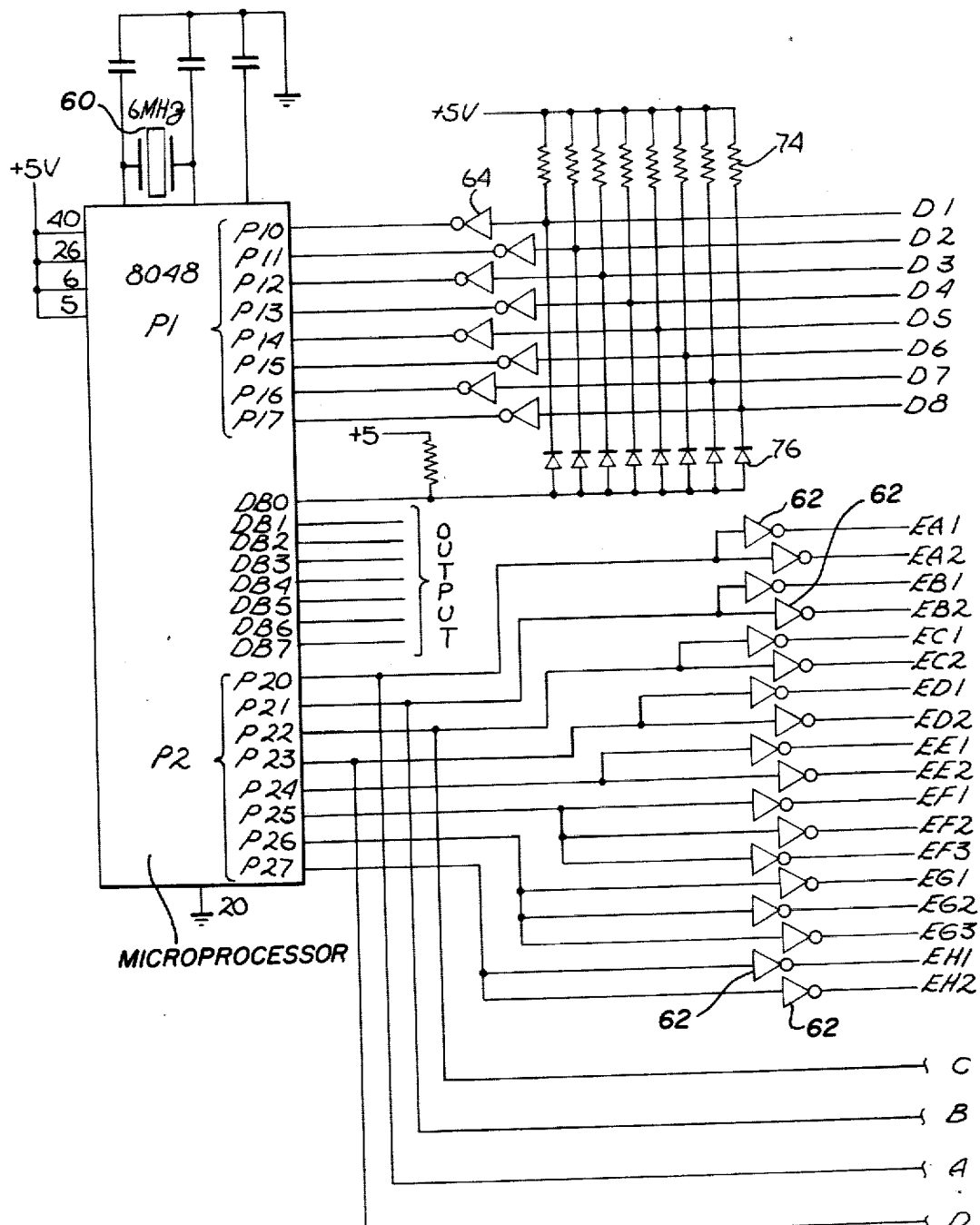
FIG. 7 is a block diagram of the microprocessor board of the exemplary embodiment of FIG. 1.

First referring to FIG. 1, a face view of one embodiment of keyboard in accordance to the present invention may be seen. This specific keyboard contains sixty keys arranged in a 5 by 12 orthogonal array on a mounting panel 20 having mounting holes 22 for mounting into a chassis 24, shown in FIG. 2, using mounting screws 26. The individual keys 28 on the keyboard shown are individually numbered 1 through 60 for purposes of subsequent easy reference in the description to follow, though of course in any typical application the keys will be identified by various combinations of numbers, letters, control codes, etc.

A side view of the keyboard of FIG. 1 may be seen in FIG. 2. The individual keys 28 are supported from the face of the panel 20, with the back of the panel being enclosed by a cover 30 with a cable 32 breaking out of the cover 30 in some convenient location. As shall subsequently be seen, the cable 32 would typically include power supply lines for supplying power to the electronics located within the keyboard assembly and for providing serial or parallel output lines, depending upon the specific type of output desired. Located within the cover 30 are a pair of circuit boards 32 and 34, circuit board 32 being referred to as the sensor board and circuit board 34 being referred to as the microprocessor board.

Now referring to FIGS. 3 and 4, a cross-section taken through a typical key such as along lines 3—3 of FIG. 1, and a bottom view of a key mechanism may be seen.

In this embodiment the stationary portion of the key, that is the key body, is comprised of an upper body member 36 and lower body member 38, the lower body member having an upward extending portion 40 for passing through an opening in the panel 20 and snaping into the upper body member 36 to retain the two members in cooperative assembly tightly against the opposite faces of panel 20. The openings provided in panel 20 for the key body members 38 are generally circular openings, which in the preferred embodiment extend outward in two local regions to receive an indexing tab 40 for angularly orienting the lower body member. In that regard the key shaft 42 is generally cruciform shaped in cross-section (see FIG. 4) and has a loose sliding fit within a cruciform shaped opening at the bottom of the lower body member 38 to angularly orient the key shaft therein. The upper portion of the key shaft 44 is also cruciform shaped in cross-section for pressing into an adaptor member 46 over which a key cap 48 may be pressed, the key cap characterizing the individual key and customizing it for a particular application. The central region 50 of the key shaft is generally circular, lying within the inner diameter of lower body member 38 and being yieldably encouraged to the uppermost position by a coil spring 52. Of course, immediately below the lower portion 42 of the key shaft is the sensor board 32, so that on depression of the key, the lower end 42 of the key shaft will extend downward to the printed circuit board. In that regard the lower limit of travel of each individual key may be defined by the mechanical limits of the key assembly or by the contact of the lower end 42 of the key shaft with the sensor board. Also, if desired, openings may be provided in the sensor board 32 below each key shaft to allow penetration of the key shaft thereinto.

Now referring to FIG. 5, a schematic illustration of a top view of the sensor board 32 may be seen. The key shafts 42 of the sixty individual keys are shown in phantom in the figure and are numbered 1 through 60 as before. Also shown in the figure as eighteen light-emitting diodes 54 arranged in a specific array with respect to the key shafts 42, and twenty-one phototransistors 56 also arranged in a particular array with respect to the key shafts. For reasons which shall subsequently become more apparent, the light-emitting diodes 54 are grouped into eight groups identified for purposes of reference as A through H. Thus, as may be seen in FIG. 6, the top row of LED's contain two LED's associated with group A, with no LED's in the second or third rows being associated with that group. Groups F and G each contain three LED's, with the remaining groups having only two therein. Similarly, the phototransistors 56 are also arranged in eight groups, these groups being numbered 1 through 8 for subsequent reference.

Looking first at the upper left hand portion of the sensor board 32, it will be noted that the first LED 54 associated with group A directs light (as shown by way of the dashed lines) under the key shaft 42 of switch number 1 to one of the phototransistors 56 associated with group 8 detectors. The same LED also directs light under key 13 and one of the detectors associated with group 7, under key 14 to one of the detectors associated with group 1, and under key 2 to one of the detectors associated with group 5. The other LED associated with group A directs light under keys 9, 10, 21 and 22 to detectors associated with groups 6, 4, 2, and 3, respectively. Thus, if only the LED's associated with group A are illuminated, one and only one phototransistor associated with each of the eight detector groups is illuminated. If at this same time, any of keys 1, 2, 9, 10, 13, 14, 21 or 22 is depressed, the associated light beam will be interrupted by the key shaft 42 so that one of the eight detectors, or more importantly, one of the detectors associated with one of the eight groups, will no longer be illuminated, thereby detecting the depression of the key. The general organization of the LED's and detectors is given by the following table:

|  |  | DETECTOR GROUP NUMBER | | | | | | | |
|---|---|---|---|---|---|---|---|---|---|
|  |  | 1 | 2 | 3 | 4 | 5 | 6 | 7 | 8 |
| LED GROUP LETTER | A | 14 | 21 | 22 | 10 | 2 | 9 | 13 | 1 |
|  | B | 15 | 16 | 23 | 11 | 3 | 4 | 24 | 12 |
|  | C | 47 | 17 | 35 | 18 | 6 | 5 | 36 | 48 |
|  | D | 26 | 20 | 38 | 19 | 7 | 8 | 25 | 37 |
|  | E | 27 | 23 | 39 | X | 56 | 40 | 55 | X |
|  | F | 58 | 29 | 50 | 30 | 57 | 41 | 42 | 49 |
|  | G | 59 | 32 | 51 | 31 | 44 | 52 | 43 | 60 |
|  | H | 46 | 33 | 34 | X | 45 | 53 | 54 | X |

In essence, there are a potential of eight detectors associated with each LED group, providing eight combinations of eight or sixty-four potential light source, signal source combinations. Since the embodiment being described herein is a sixty-key keyboard, four of the possible combinations are really not present, as shown by the X's in the foregoing chart. Obviously, however, the 8-by-8 relationship and the general layout of the LED's and detectors may be varied as required or applicable for a particular keyboard of different physical configuration or different numbers of keys, though the 8-by-8 matrix is particularly convenient for control and data reduction by an eight bit microprocessor. In particular, looking at the chart just presented, the detection of any specific numbered key (such as by way of example key number 56) may be accomplished by turning on the group of LED's in the row associated with the key in the table (and only that group, group E being applicable for key 56) and looking at the state of the detectors in the group number associated with the column of the chart for the specific key in question (group 5 for key 56).

Before proceeding with the explanation of the electronics and means of operating the keyboard, it is perhaps first helpful to point out certain characteristics and advantages of the keyboard structure just described. Preferably, the light-emitting diodes 54 are relatively wide angle emitters. LED's of this characteristic are manufactured in large quantities and sold for such purposes as indicator lamps, and accordingly wide angle devices are readily commercially available at low cost. The specific LED's used in the preferred embodiment are LED's manufactured by Fairchild and sold as their FMV5052 LED's. Similarly, the phototransistors 56 should also be relatively wide angle detectors, with Motorola phototransistors identified as their part number 21-L14H2 being used. It has been found that by appropriate excitation and sensing, the optical cross-talk can be held to a minimum so that individual light channels for defining the possible light paths and preventing the undesired light paths are not generally required, thereby grossly reducing the cost of tooling and production. By way of specific example, the upper left hand LED 54 associated with group A will generally not provide sufficient peripheral illumination to be picked up by the third phototransistor 56 in the first row of phototransistors (associated with group 6), so that no specific structure is required to block this possible light path. In this regard, note that many of the top row of light-emitting diodes are not visible to the middle row of detectors because of the presence of the second row of light-emitting diodes therebetween. It has been found that the top row of light-emitting diodes, however, may on occasion provide sufficient illumination to the bottom row of detectors to provide a false reading therefrom, and accordingly as shall subsequently be seen, most of the bottom row of detectors is essentially disabled whenever one of LED groups A through D are turned on. (Note that in this particular embodiment no LED group contains LED's in both the first and third rows of LED's.)

Now referring to FIG. 6, a cross section taken along lines 6—6 of FIG. 5 may be seen. This cross section illustrate the mounting of a typical LED 54 and phototransistor 56. Generally speaking, both devices are disposed at the appropriate altitude above the sensor board 32 on its leads, with the leads passing through printed circuit board holes for soldering to the printed circuit thereunder. Obviously for high vibration environments, etc. a specific spacer and support could be located under each device, though in general it is desirable to have the sources and sensors so positioned that the key shaft may extend well into and preferably even through the optical path therebetween. Of course, if a hole is placed in the sensor board 32 below each key shaft, the light sources and detectors may be disposed substantially flat on the printed circuit board.

Figure 8:
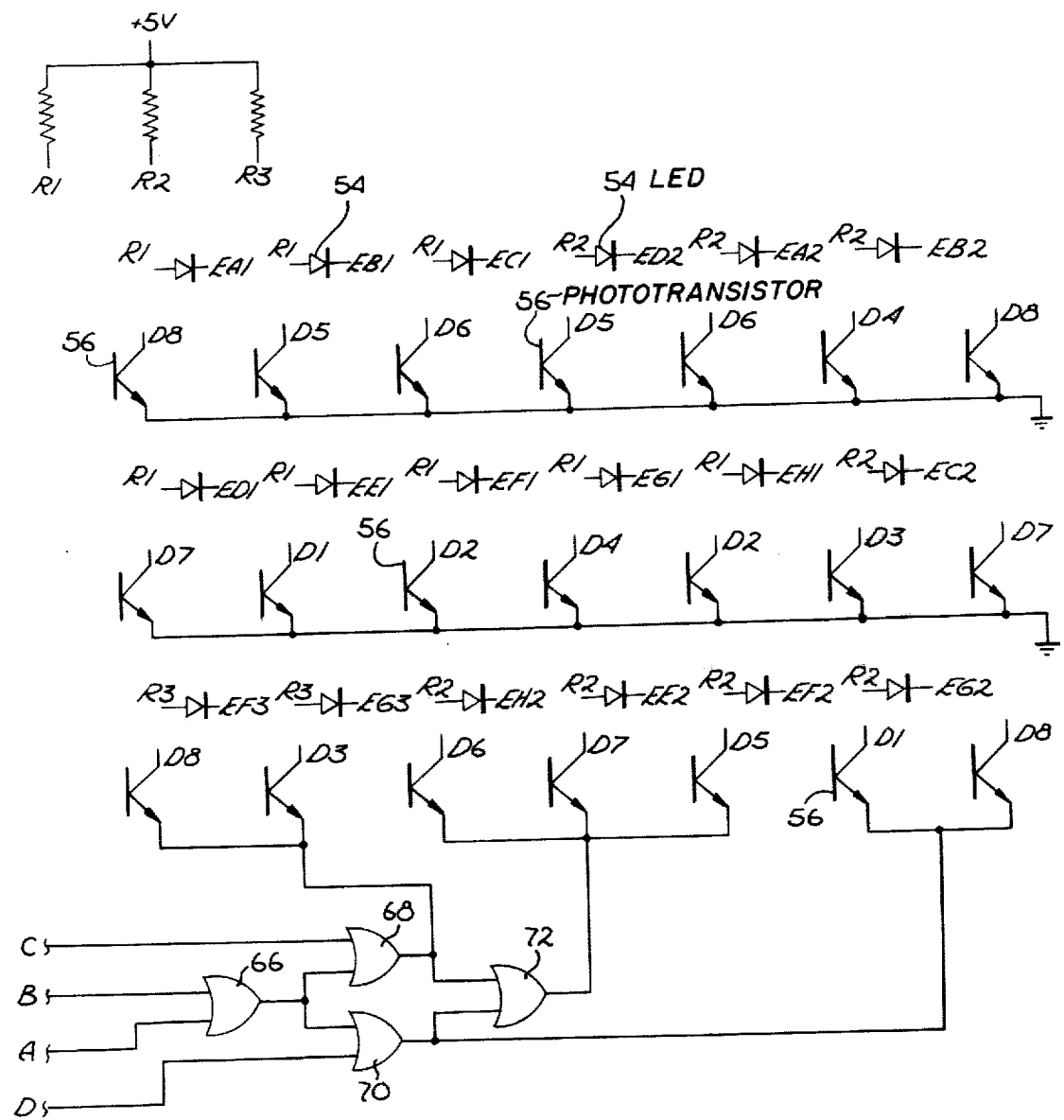
FIG. 8 is the circuit diagram for the sensor board of FIG. 5.

In the preferred embodiment, the keyboard of the present invention is controlled by the microprocessor-based control circuitry shown in block diagram form in FIGS. 7 and 8. The specific microprocessor utilized in this embodiment is an 8048 manufactured by Intel Corporation of Mountain View, Calif. A 6 MHz crystal 60 is used for a clock reference, with one port P2 comprising lines P20 through P27 being used as an output port, and another port P1 comprising lines P10 through P17 being used as an input port. There is also an 8 bit data bus DB, the first line DB0 of which is used as part of the keyboard control. The remaining bits (DB1 through DB7) may be used as the basic keyboard signal output lines (1 being used if a serial output is desired, or a plurality being used for a parallel output). As may be seen in the figure, the lines P20 through P23 on port P2 are used to provide signals A, B, C and D, with all of lines P20 through P27 being inverted by inverters 62 to provide the signals EA1, EA2, EB1, etc. through EH2. In that regard, it was previously noted that in this particular embodiment, light emitting diode groups F and G each had three LED's therein, the remaining groups only having two. In FIG. 7, it will be noted that the signals on lines P25 and P26 are each inverted through three inverters to provide three signals, EF1 through EF3 and EG1 through EG3 respectively, so that as shall subsequently be seen, a signal on line P20 is used to provide the two signals EA1 and EA2, each for driving one of the two LED's in group A, etc., with the three LED's in each of groups F and G each being individually driven by one of the respective inverter outputs driving signals from lines P25 and P26. In the preferred embodiment, the eighteen inverters 62 comprise three hex Darlington drivers, manufactured by Texas Instruments and sold as their Part Number 75492.

The first port P1 is used as an input port with signals D1 through D8 being coupled through Schmitt triggers 64 to lines P10 through P17 (the eight Schmitt triggers in the preferred embodiment comprise two quad Schmitt triggers, manufactured by Motorola and sold as their Part No. MC-14584).

Referring now to FIG. 8, the specific circuit connections on the sensor board may be seen. In this figure the eighteen LED's 54 and the twenty-one phototransistors 56 are physically positioned in the same general matrix locations as shown in FIG. 5. All emitters of the phototransistors in each of the first two rows of phototransistors are coupled to ground. The emitters in the third row of transistors, however, are coupled to the outputs of OR gates 66, 68, 70 and 72. (In the preferred embodiment, a quad OR gate manufactured by Motorola and sold as their part number MC-14071). The inputs to the OR gates are the signals A through D so that the emitters in the lower row of phototransistors are only coupled to ground dependent upon the states of signals A through D. In that regard the emitters of the first two phototransistors in the lower row are only tied to ground whenever the output of OR gate 68 and therefore also the output of OR gate 66 is low, or when A, B and C are low. Similarly, the emitters for the right hand two phototransistors in the lower row are tied to ground only when A, B and D are low, whereas the emitters for the center three phototransistors are tied to ground (i.e. go low) only when A, B, C and D are low. In essence this coupling is complimentary to the phototransistor grouping in that the first light-emitting diode in the second row is associated with the D group and illuminates the first two phototransistors in the bottom row, whereas the last light-emitting diode in the second row is associated with the C group and illuminates the last two phototransistors in the bottom row. The central three phototransistors in the bottom row, however, are not functional on any of the A, B, C or D LED groups.

As previously mentioned, the light-emitting diodes are coupled to signals EA1 through EH2 in accordance with the identifications provided in FIG. 8. The other lead of each LED is coupled to one of resistors R1, R2 and R3 which in turn are coupled to the positive reference voltage. The resistors R1 through R3 are current limiting resistors for the LED's, three such resistors being adequate as no more than three LED's are ever on at the same time, and the interconnection identified in FIG. 8 provides at the most, one operating LED coupled to each resistor at any particular point in the operating cycle. Finally, the collectors of the twenty-one phototransistors 56 are coupled to the data lines D1 through D8 (see FIG. 7) in the manner specifically identified in FIG. 8, with each of these lines being normally pulled high by a respective one of pull-up resistors 74 (FIG. 7).

Before proceeding to a detailed description of the logic diagram, it is important to note the electrical characteristics of the LED-phototransistor combinations with the specific circuitry given. In particular, for purposes of illustration assume that the microprocessor drives line P20 high with P21 through P27 being low. Signals EA1 and EA2 will therefore go low, with the remaining signals being high. When EA1 goes low, the first LED in the first row of LED's turns on, with signal EA2 going low turning on the next to the last LED in the first row (see FIG. 8). With all keys up, the light emitted by these two LED's will be detected by the four phototransistors associated with each LED to provide eight signals on the data lines D1 through D8. In that regard the lines D1 through D8 have a fairly low though very definite capacitance and, if all such lines initially were high, the lines will discharge to a lower state at a fast though definitely limited rate. In particular a phototransistor is constructed so that the base region thereof may receive incident light, which light generates minority charge carriers in the base region in proportion to the intensity of the incident light. This is equivalent to providing a specific though limited base current to an ordinary transistor, which effectively operates the transistor as a current source. It is this current source which is discharging the capacitance of lines D1 through D8 so that the rate at which these lines discharge from the high state to a lower state is dependent on resistors 74 and the phototransistor current, or alternatively, the length of time it takes any of these lines to go sufficiently low to trigger the Schmitt trigger 64, will depend upon the intensity of the light incident on the respective phototransistors. With all keys up, the incident light will be relatively intense so that the lines D1 through D8 will trigger the Schmitt triggers in a matter of microseconds from the time any particular LED group is turned on by one of lines P20 through P27. As any key which is in the group keys being detected by that particular LED group is depressed, the key shaft will reduce the intensity of the light incident to the respective phototransistor so that the rate of discharging of the respective one of the data lines D1 through D8 will be reduced. Thus, in the preferred embodiment, key depression is detected by the fact that the particular Schmitt trigger for the respective data line is not triggered within a given length time when the appropriate LED group is turned on. In particular, in the preferred embodiment approximately two milliseconds is allowed after each LED group is turned on for all of the data lines D1 through D8 to go low, after which if any of the lines have not gone sufficiently low to trigger the respective Schmitt triggers, the microprocessor identifies that key or keys as being depressed. Further, once a key has been identified as being depressed, approximately one millisecond is allowed in subsequent scans to determine when the key has been released. In this manner hysteresis is specifically provided for each key by the fact that it takes less light to detect key depression than key release, so that the depression switching point is a lower key position than the release switching point. Finally, because of the capacitance in the various lines and the need to recharge the lines D1 through D8 to the high state on each cycle, the output data bus line DBO is pulsed high just before each LED group is turned to charge the lines D1 through D8 to the high state through diodes 76. In the description of the logic diagram to follow, the charging of these lines is referred to as a quench, as the effect of this signal is to quench all data lines in readiness for the turning on of the next LED group.

Figure 9:
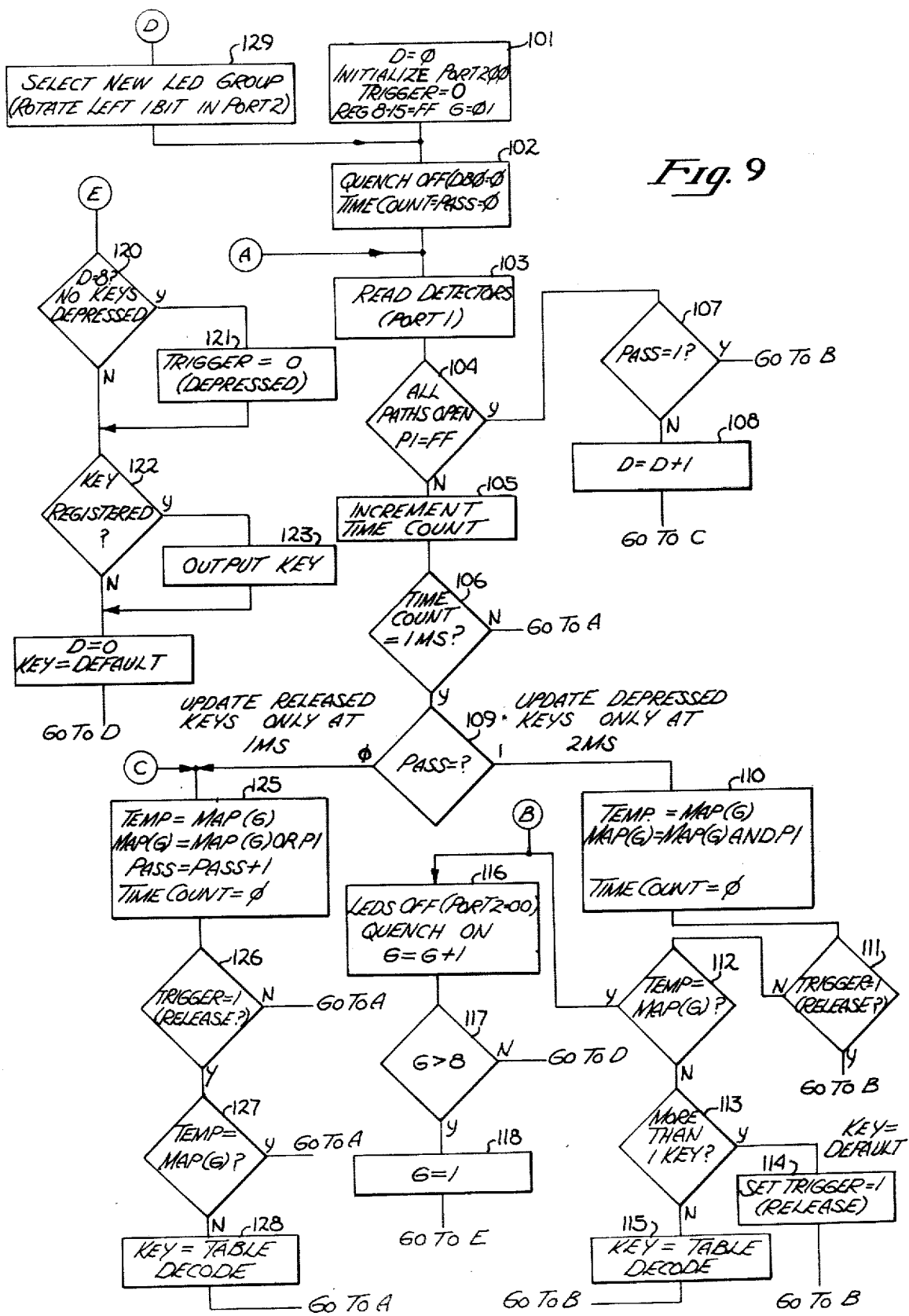
FIG. 9 is a logic flow diagram for the microprocessor.

Now referring to FIG. 9, a typical logic flow diagram for the programming of the microprocessor may be seen. The system normally will be turned on with all keys up. On turn on, the program will initialize the system (Block 101 in FIG. 9) by setting port 2 to all zeros, by setting registers 8 through 15 to all ones (FF in hexadecimal), by setting a register G=01 (hexadecimal), by setting a register D=0 and a TRIGGER register equal to zero. Registers 32 to 39 are in effect utilized as a memory map of the keyboard, providing an 8 by 8 matrix in memory against which the eight data signals for each of the eight LED groups may be compared. The register G is a register for a number effectively representing which LED group is being turned on, with another register having a single bit high for sequentially shifting left (rotating) to cycle through the LED groups through port P2. D, on the other hand, is a register for holding a number equal to the number of times the electronics has seen no key depression. It is incremented every time no keys are depressed and is used to reset the TRIGGER. In that regard TRIGGEr is a flag, in that TRIGGER =0 will register a key, i.e. provide an output for that key, whenever the key goes down, whereas TRIGGER =1 will register that key only whenever the key goes up. As shall subsequently be seen, if two keys are down at the same time, neither key will register until one of the keys goes up, so that key operation will then be determined by the first key to be released. (Also on initialization a register identified as KEY is set equal to zero, representing a default setting.) Finally, on initialization the quench is pulsed to charge all data lines. These various functions are generally illustrated in block 101 of FIG. 9. The next step (block 102) is to turn off the quench and set a time count equal to the zero. The time count is maintained in a register which is periodically incremented as part of the basic scanning sequence so as to provide the one millisecond and two millisecond time counts. In that regard a separate register identified as PASS is set equal to zero or one indirectly dependent upon the time count, as shall subsequently be seen.

The next step (block 103) is to read the eight detector signals on lines D1 through D8. For all paths to appear open (block 104) the lines D1 through D8 must all be pulled low, which as previously stated will require some time to accomplish even with all keys up. Consequently, on the first test probably all paths will not appear open so that in block 105 the time count is incremented and tested in block 106 to determine whether or not the time count has reached one millisecond. (If it has, then the system will proceed to determine whether the pressed key information or released key information should be updated depending upon the state of PASS.) Assuming one millisecond time count has not been reached, the routine returns to A, again reading detectors (block 103), etc. and recycling until either the one millisecond time count is reached or all paths are found to be open. If all keys are up, port P1 will go to FF in approximately 10 microseconds from the turning on of the respective LED group. When this happens, the state of PASS is tested (block 107) and of course, found to be zero. PASS =0 represents the state for which the system will look for released keys, whereas PASS =1 represents the state in which the system will test for depressed keys. Since all keys for the first LED group are up as detected by all paths being open, the testing for a change in the released keys may proceed immediately. Thus, at this point D is incremented (block 108) and the testing for released keys proceeds in block 125.

For the testing for released keys the temporary register is loaded with a map of the prior existing state of that key group as recorded in one of registers 8 through 15 (initially set to FF) in accordance with the count in the G register, which as previously mentioned represents the LED group currently on. This is referred to as MAP(G) in block 125. Thereafter, MAP(G) is updated by ORing the MAP(G) with the eight bit signal on port P1(i.e. data lines D1 through D8). Since initially both MAP(G) and P1 will be high (all data lines D1 through D8 being low as a result of all keys being up), no change in MAP(G) will occur. Also at this time, PASS is set equal to PASS +1 and the time count is set to zero. In block 126, TRIGGER is tested, and since it remains at zero from the initial setting in block 101, the system returns to block 103 to again read the detectors and determine that all paths are open. This time in proceeding to block 107 it is noted that PASS equals one, whereby all LED's are turned off, the quench is turned on to charge all data lines high and register G is incremented (Block 116). If G is eight or less, the sequence proceeds to block 129 where a new LED group is selected by rotating port 2 left one bit. The quench is then turned off, the time count and PASS reset to zero and the state of the detectors is again read in block 103. If G exceeds eight, indicating that all LED groups have now been tested, G is reset to one in block 118 and the system proceeds to the output sequence starting on block 120.

In block 120, D is tested to see whether it equals eight. If it does (D ranging from 0 to 7) the trigger is set to zero so that the system will register a key when the key is depressed. If it is not equal to eight, (thereby indicating that not all eight LED groups have been so tested) the system will proceed to determine whether a key has registered as a result of the operations in blocks 115 and 128. (In the example given with all keys up a key will not have registered.) If a key has registered, i.e. KEY≠0, the system will output that key on one or more of the output lines DB1 through DB7, but in any event will proceed to set D=0 and return to block 129 to start the sequence again.

The foregoing sequence will be continuously repeated so long as all keys remain up. However, as soon as one key is depressed the test in block 104 to determine whether all paths are open will not occur before the time count reaches one millisecond (block 106), in which event the system tests for the state of PASS, which of course remains zero as previously set in block 102. Accordingly, the system tests for the release of keys by proceeding to block 125. Since MAP(G) equals FF, there is no updating in the ORing operation of block 125. After PASS is set equal to one and the time count is reset, the system returns to block 103 since TRIGGER is in the zero state. (In general, it may be desired to drive the LED's at the high average current to maximize their light output. Since partial depression of one key will increase the duty cycle for that one LED group, the microprocessor may be programmed to monitor this and inject an idle mode to avoid exceeding the LED limits.)

After returning to block 103, the sequence of blocks 103 to 106 is continuously repeated until the time count again reaches one millisecond. Thereafter, since now PASS=1, a test for updating depressed keys proceeds in block 110. In particular, the temporary register is again provided with a MAP(G) and then the one of registers 32 through 39 corresponding to the count G is updated for depressed keys by ANDing MAP(G) with P1, i.e. the eight bits on the microprocessor port P1. If only one key was depressed, one of the lines on port P1 will be low, so that the corresponding bit of the corresponding register of the group of registers 32 through 39 will be set low, (Of course, if two or more keys in the group of keys being tested are down, the corresponding two or more bits will be set low.) Thereafter, the time count is set equal to zero and the TRIGGER tested. Since the TRIGGER is still zero, having been set to zero in block 101 and not yet changed, the temporary register will be compared with MAP(G) in block 112. If one key only is detected as being depressed, a look up table is used to determine what key it is and to set that key in the KEY register. Thereafter, the sequence then proceeds to block 116, then proceeding as hereinbefore described. Note that the test of block 113 is a global test, in that more than one key being depressed may show up within any one LED group, or one key depressed may show up on one LED group and a second key depressed may show up on a second LED group, as the output sequence starting on block 120 is not initiated until G exceeds 8 in the test of block 117. On the occurrence of more than one key being depressed, as in the test of block 113, the KEY register is set in the default mode, that is set equal to zero, the TRIGGER is set equal to one and the sequence again proceeds to block 116. With KEY equal default equal zero, the test in block 122 will indicate no key registered, so that no output will result, but instead the system will return to block 120 to proceed with the test of the detectors associated with the next LED group. Thus it may be seen that the entire keyboard is tested to determine whether one or more keys have been depressed, and if more than one key has been depressed, the TRIGGER is set equal to one and the KEY register is set equal to zero. The system will then continue to scan the keyboard by sequentially turning on each LED group and testing the detectors, updating the registers 32 through 39 for any subsequently depressed keys by the update of block 110, but not proceeding to block 112 because of the state of the trigger as tested in block 111. However, because of the state of the trigger, the test for the released keys will proceed through blocks 125 and 126, and whenever the test of block 127 shows a difference between the temporary register and MAP(G), the look up table is again used to determine what key came up and to identify that key in the KEY register, whereupon the system returns to block 103, ultimately proceeding through the output sequence to output the key first released through block 123. Thus, in this manner if two or more keys are pushed simultaneously or two keys pushed with additional keys being pushed before the two are released, the system will record the keys not in the order in which they went down but the order in which they are released.

There has been described herein an exemplary embodiment of new and unique keyboards together with an exemplary hardware and software design for scanning keyboards to determine the order in which the output signals should identify key depression and/or key release. The preferred embodiments have the advantage that no individual light channels are required, but instead a plurality of light sources and light detectors are so arranged and electrically grouped so that individual key depressions may be detected by the blocking of light between one source and one detector. The arrangement allows the sharing of one light source by a plurality of detectors, and similarly the sharing of one detector by a plurality of light sources to minimize the number sources and detectors required for a given keyboard. Since light path blocking rather than reflection or transmission provides the detection signal, positive action may be obtained in comparison to reflective type devices wherein the accuracy of alignment and the cleanliness of the reflective surface are critical parameters for practical operation. Further, the microprocessor based scanning system disclosed herein automatically provides switch hysteresis to avoid double switching (equivalent to switch bounce) and to provide a system which has the potential of operating in high vibration environments. Since the mechanical portion of the keyboard is kept very simple, switching is not dependent upon any mechanical switch closure and the sensor board and microprocessor board may be dipped for moisture resistance, the keyboard may be rendered capable of operating even when wetted such as by way of an accidental coffee spill. Obviously, while the preferred embodiment injects switch hysteresis as a result of the time response of the photoelectric portion of the keyboard, other methods of injecting hysteresis such as electrical or mechanical methods may also be incorporated as desired. Similarly, the light sources and light detectors for the phototransistors, photoconductors or photovoltaic devices may be arranged in different patterns and matrixes, though it is generally preferred that the light sources and detectors be so arranged that unambiguous states of each key may be determined on a single scan. In that regard, an obvious alternative is to provide light blockage when the key is released and light transmission when the key is depressed.

As a still further alternative, each key shaft, adapter and cap may be made at least semitransparent, with the lower end 80 of the shaft (see FIG. 10) angled to approximately face the LED's. So long as at least the shaft face 82 facing the phototransistors is not substantially transparent, the keyboard will operate as described, but in addition each key will appear lighted by the transmission of the LED emission out through the key cap (preferrably diffusing the light at the cap). While light may then also enter the keyboard enclosure, it will be directed toward the LED's, not the phototransistors, so it will not effect their operation.

Thus, while a specific exemplary embodiment has been disclosed and described in detail herein, it will be understood by those skilled in the art that various changes in form and detail may be made therein without departing from the spirit and scope of the invention.

I claim:

1. A photo-optical keyboard comprising:
   keying means having a plurality of individual keys, each moveable between a released position and a depressed position and having a means for yieldably encouraging each said key to said released position;
   a plurality of light sources, said plurality of light sources being less in number than said plurality of individual keys;
   a plurality of light sensors, said plurality of light sensors being less in number than said plurality of individual keys, at least some of said light sources being disposed to direct different portions of the light therefrom toward different ones of said light sensors, said last named light sources and light sensors being positioned with respect to specific ones of said keys so that for each key of said last named keys, that said key and only that said key may substantially block light between a specific one of said light sources and a specific one of said light sensors when in one of said released and depressed positions and not substantially block light when in the other of said released and depressed positions, whereby the depression of any of said last named keys may be detected by the turning on of the associated one of said light sources and the detecting of the state of the said light sensors associated therewith.

2. The keyboard of claim 1 wherein each of said keys substantially blocks light between a light source and a light sensor when depressed.

3. The keyboard of claim 1 further comprised of scanning means, said scanning means including means for sequentially turning on said plurality of light sources and means for detecting the state of said light sensors associated therewith to detect the depression of any of said plurality of individual keys.

4. The keyboard of claim 3 further comprised of means for disabling at least some of said light sensors not associated with any of said light sources being turned on.

5. The keyboard of claim 1 wherein said plurality of light sources are grouped into a lesser number of light source groups, each of said light sources in each of said light source groups being disposed to illuminate different ones of said light sensors, and further including means for sequentially turning on each of said light source groups and means for detecting the state of said light sensors associated therewith.

6. The keyboard of claim 1 wherein said plurality of light sensors are grouped into a lesser plurality of light sensor groups, each of said light sensor groups being associated with at least one of said light sources, said light sensors in each said light sensor group being coupled in parallel with said light sensors in each other said light sensor group and to a plurality of output lines, whereby the state of said light sensors in any said light sensor group may be detected on said plurality of output lines.

7. The keyboard of claim 1 wherein said plurality of light sources are grouped into a lesser number of light source groups, each of said light sources in each of said light source groups being disposed to illuminate different ones of said light sensors, and further including means for sequentially turning on each of said light source groups and means for detecting the state of said light sensors associated therewith, said plurality of light sensors also being grouped into a lesser plurality of light sensor groups, each of said light sensor groups being associated with one of said light source groups, said light sensors in each said light sensor group being coupled in parallel with said light sensors in each other said light sensor group on a plurality of output lines, whereby the state of said light sensors in any said light sensor group may be detected on said plurality of output lines, independent of which said light source group is turned on.

8. The keyboard of claim 3 further comprised of means for detecting the simultaneous depression of more than one of said individual keys and for responding to the release of said last named individual keys to provide an output indicative of said last named individual keys in the order of release thereof.

9. The keyboard of claim 1 wherein said light sources direct light toward said light sensors without specifically defined light channels therebetween.

10. The keyboard of claim 1 wherein a portion of each said individual key is substantially transparent, said substantially transparent portion being disposed so as to receive light from said light sources to illuminate said keyboard.

11. The keyboard of claim 1 wherein said light sensors are conductive in response to light incident thereto, said light sensors each being coupled in circuit to encourage a respective one for a plurality of electrical lines from a first electrical state toward a second electrical state, said keyboard further comprising means for charging said electrical lines to said first state, for sequentially turning on said plurality of light sources and for detecting the charge in said lines to said second state within a first predetermined time indicating depression of any of the respective said individual keys.

12. The keyboard of claim 11 further comprised of means for detecting the charge in said lines to said second state within a second predetermined time indicating release of any of the respective said individual keys, said first and second predetermined times being unequal, whereby a hysteresis is provided between the depressed and the released positions.

13. A photo-optical keyboard comprising;
   keying means having a first plurality of individual keys, each moveable between a released position and a depressed position and having a means for yieldably encouraging each said key to said released position;
   a plurality of light sources, said plurality of light sources being less in number than said plurality of individual keys;
   a plurality of light sensors, said plurality of light sensors being less in number than said plurality of individual keys, at least some of said light sensors being disposed to receive light directed thereto by different ones of said light sources, said last named light sources and light sensors being positioned with respect to specific ones of said keys so that for each one key of said last named keys, that said key and only that said key may substantially block light between a specific one of said light sources and a specific one of said light sensors when in one of said released and depressed positions and not substantially block light when in the other of said released and depressed positions, whereby the depression of any key may be detected by the turning on of the associated said light source and the detecting of the state of the said light sensors associated therewith.

14. The keyboard of claim 13 wherein each of said keys substantially blocks light between a light source and a light sensor when depressed.

15. The keyboard of claim 13 further comprised of scanning means, said scanning means including means for sequentially turning on said plurality of light sources and means for detecting the state of said light sensors associated therewith to detect the depression of any of said plurality of individual keys.

16. The keyboard of claim 15 further comprised of means for disabling at least some of said light sensors not associated with any of said light sources being turned on.

17. The keyboard of claim 13 wherein said plurality of light sources are grouped into a lesser number of light source groups, each of said light sources in each of said light source groups being disposed to illuminate a different one of said light sensors, and further including means for sequentially turning on each of said light source groups and means for detecting the state of said light sensors associated therewith.

18. The keyboard of claim 13 wherein said plurality of light sensors are grouped into a lesser plurality of light sensor groups, each of said light sensor groups being associated with at least one of said light sources, said light sensors in each said light sensor group being coupled in parallel with said light sensors in each other said light sensor group and to a plurality of output lines, whereby the state of said light sensors in any said light sensor group may be detected on said plurality of output lines.

19. The keyboard of claim 13 wherein said plurality of light sources are grouped into a lesser number of light source groups, each of said light sources in each of said light source groups being disposed to illuminate different ones of said light sensors, and further including means for sequentially turning on each of said light source groups and means for detecting the state of said light sensors associated therewith, said plurality of light sensors also being grouped into a lesser plurality of light sensor groups, each of said light sensor groups being associated with one of said light source groups, said light sensors in each said light sensor group being coupled in parallel with said light sensors in each other said light sensor group on a plurality of output lines, whereby the state of said light sensors in any said light sensor group may be detected on said plurality of output lines, independent of which said light source group is turned on.

20. The keyboard of claim 15 further comprised of means for detecting the simultaneous depression of more than one of said individual keys and for responding to the release of said last named individual keys to provide an output indicative of said last named individual keys in the order of release thereof.

21. The keyboard of claim 13 wherein said light sources direct light toward said light sensors without specifically defined light channels therebetween.

22. The keyboard of claim 13 wherein a portion of each individual said key is substantially transparent, said substantially transparent portion being disposed so as to receive light from said light sources to illuminate said keyboard.

23. The keyboard of claim 13 wherein said light sensors are conductive in response to light incident thereto, said light sensors each being coupled to a respective one of a plurality of electrical lines to encourage that one of said electrical lines from a first electrical state toward a second electrical state, said keyboard further comprising means for charging said electrical lines to said first state, for sequentially turning on said plurality of light sources and for detecting the change in charge in said lines to said second state within a first predetermined time indicating depression of any of the respective said keys.

24. The keyboard of claim 23 further comprised of means for detecting the change in charge in said lines to said second state within a second predetermined time indicating release of any of the respective said keys, said first and second predetermined times being unequal, whereby a hysteresis is provided between the depressed and the released positions.

25. A keyboard comprising;
   a keyboard panel assembly having a plurality of keys each being yieldably encouraged to an upper released position and being depressible to a lower depressed position, each of said keys having a lower key member extending below the rest of said panel assembly when the respective said key is depressed;
   support means disposed below said panel assembly;
   a plurality of light sources, supported by said support means, said plurality of light sources being less in number than said plurality of keys;
   a plurality of light sensors supported by said support means, said plurality of light sensors being less in number than said plurality of keys, at least some of said light sources being disposed to direct different portions of the light therefrom toward different ones of said light sensors, at least some of said light sensors being disposed to receive light directed thereto by different ones of said light sources, said last named light sources and light sensors being positioned with respect to specific ones of said keys so that, for each key of said last named keys, said lower key member of said key may substantially block light between a specific one of said light sources and a specific one of said light sensors when in said depressed position and not substantially block light when in said released position, whereby the depression of any key may be detected by the turning on of the associated said light source and the detecting of the state of the said light sensors associated therewith.

26. The keyboard of claim 25 wherein said plurality of light sources are electrically grouped into a lesser number of light source groups, said plurality of light sensors are electrically grouped into a lesser plurality of light sensor groups, each of said light sensor groups being associated with at least one of said light source groups, said light sensors in each said light sensor group being coupled in parallel with said light sensors in each other said light sensor group and to a plurality of output lines, whereby the state of said light sensors in any said light sensor group may be detected on said plurality of output lines.

27. The keyboard of claim 25 wherein said light sources direct light toward said light sensors without specifically defined light channels therebetween.

28. The keyboard of claim 25 further comprised of means for detecting the simultaneous depression of a plurality of said keys and for responding to the release of said keys to provide an output indicative of said keys in the order of release thereof.

29. The keyboard of claim 25 wherein said light sensors are conductive in response to light incident thereto, said light sensors each being coupled in circuit to encourage a respective one of a plurality of electrical lines form a first electrical state toward a second electrical state, said keyboard further comprising means for sequentially charging said electrical lines to said first state, for turning on different ones of said plurality of light sources and for detecting the change in said lines to said second state within a first predetermined time indicating depression of any of the respective said keys.

30. The keyboard of claim 29 further comprised of means for detecting the change in said lines to said second state within a second predetermined time indicating release of any of the respective said keys, said first and second predetermined times being unequal, whereby a hysteresis is provided between the depressed and the released positions.

31. The keyboard of claim 26 further comprised of scanning means, said scanning means including means for sequentially turning on each of said light source groups and means for detecting the state of said output lines to detect the depression of any of said plurality of individual keys.

32. Apparatus responsive to the position of a moveable element comprising;
- light sensor means for being electrically conductive in response to light incident thereto, said light sensor means being coupled in circuit to encourage an electrical line from a first electrical state to a second electrical state upon receipt of light.
- light source means for directing light to said light sensor means in a manner to be interrupted to an extent dependent on the position of the moveable element;
- means for sequentially charging said electrical line to said first state, for sequentially turning on said light source means, and for determining whether said electrical line goes to said second state within a predetermined time as a measure of the position of the moveable member.

* * * * *